US010131803B2

United States Patent
Sohn et al.

(10) Patent No.: US 10,131,803 B2
(45) Date of Patent: Nov. 20, 2018

(54) PREPARATION METHOD OF GRAPHENE AND DISPERSED COMPOSITION OF GRAPHENE

(71) Applicant: LG Chem, Ltd., Seoul (KR)

(72) Inventors: Kwon Nam Sohn, Daejeon (KR); Kwang Hyun Yoo, Daejeon (KR); Won Jong Kwon, Daejeon (KR); Kil Sun Lee, Daejeon (KR); Seung Bo Yang, Daejeon (KR); In Young Kim, Daejeon (KR); Mi Jin Lee, Daejeon (KR); Jin Yeong Lee, Daejeon (KR)

(73) Assignee: LG Chem, Ltd. (KR)

( * ) Notice: Subject to any disclaimer, the term of this patent is extended or adjusted under 35 U.S.C. 154(b) by 97 days.

(21) Appl. No.: 15/039,281

(22) PCT Filed: Dec. 22, 2014

(86) PCT No.: PCT/KR2014/012640
§ 371 (c)(1),
(2) Date: May 25, 2016

(87) PCT Pub. No.: WO2015/099378
PCT Pub. Date: Jul. 2, 2015

(65) Prior Publication Data
US 2017/0158512 A1 Jun. 8, 2017

(30) Foreign Application Priority Data

Dec. 26, 2013 (KR) ........................ 10-2013-0164671
Dec. 19, 2014 (KR) ........................ 10-2014-0184902

(51) Int. Cl.
*C01B 32/19* (2017.01)
*B82Y 40/00* (2011.01)
(Continued)

(52) U.S. Cl.
CPC .............. *C09D 7/20* (2018.01); *C01B 32/184* (2017.08); *C01B 32/19* (2017.08); *C09D 1/00* (2013.01);
(Continued)

(58) Field of Classification Search
CPC . H01B 1/04; H01B 1/24; H01B 1/127; H01B 1/128; C01B 2202/02;
(Continued)

(56) References Cited

U.S. PATENT DOCUMENTS

2012/0326093 A1 12/2012 Landorf
2013/0041082 A1 2/2013 Sunderland et al.
(Continued)

FOREIGN PATENT DOCUMENTS

CN 102225758 A 10/2011
CN 102249222 B 1/2013
(Continued)

OTHER PUBLICATIONS

European Search Report for Application No. EP14874853 dated Mar. 24, 2017.
(Continued)

*Primary Examiner* — Tri V Nguyen
(74) *Attorney, Agent, or Firm* — Lerner, David, Littenberg, Krumholz & Mentlik, LLP

(57) ABSTRACT

Disclosed herein are a preparation method of graphene, capable of easily preparing a graphene flake having a smaller thickness and a large area, and a dispersed composition of graphene obtained using the same. The preparation method of graphene includes applying a physical force to dispersion of a carbon-based material including graphite or a derivative thereof, and a dispersant, wherein the dispersant includes a mixture of plural kinds of polyaromatic hydrocarbon oxides, containing the polyaromatic hydrocarbon oxides having a molecular weight of 300 to 1000 in a content of 60% by weight or more, and the graphite or the derivative thereof is formed into a graphene flake having a thickness in nanoscale under application of a physical force.

12 Claims, 10 Drawing Sheets

(51) Int. Cl.
| | |
|---|---|
| *C09D 7/20* | (2018.01) |
| *C09D 1/00* | (2006.01) |
| *C09D 5/24* | (2006.01) |
| *C09D 5/32* | (2006.01) |
| *C09D 11/52* | (2014.01) |
| *C09K 5/14* | (2006.01) |
| *H01B 1/04* | (2006.01) |
| *H01M 4/62* | (2006.01) |
| *H05K 9/00* | (2006.01) |
| *C01B 32/184* | (2017.01) |

(52) U.S. Cl.
CPC .............. *C09D 5/24* (2013.01); *C09D 5/32* (2013.01); *C09D 11/52* (2013.01); *C09K 5/14* (2013.01); *H01B 1/04* (2013.01); *H01M 4/625* (2013.01); *H05K 9/0092* (2013.01); *C01B 2204/04* (2013.01); *C01B 2204/32* (2013.01)

(58) Field of Classification Search
CPC . C01B 2202/22; C01B 31/0273; C01B 32/19; C01B 32/184; C01B 32/174; C01B 32/225
USPC ..... 252/500, 502, 511, 510; 423/445 R, 460; 977/842, 847
See application file for complete search history.

(56) References Cited

U.S. PATENT DOCUMENTS

| | | | | |
|---|---|---|---|---|
| 2013/0266869 | A1* | 10/2013 | Todoriki | H01G 11/22 429/231.8 |
| 2014/0083752 | A1* | 3/2014 | Walczak | C08J 3/02 174/257 |
| 2014/0091033 | A1 | 4/2014 | Kitano | |
| 2014/0323596 | A1 | 10/2014 | Jeong et al. | |
| 2015/0279506 | A1* | 10/2015 | Wolfrum | C09C 1/44 252/510 |
| 2015/0376014 | A1* | 12/2015 | Cesareo | B82Y 30/00 442/86 |

FOREIGN PATENT DOCUMENTS

| | | | | |
|---|---|---|---|---|
| CN | 102958591 | A | 3/2013 | |
| CN | 10313211 | * | 6/2013 | ............. C01B 31/04 |
| CN | 103130211 | A | 6/2013 | |
| CN | 103466603 | A | 12/2013 | |
| EP | 3002313 | A1 | 4/2016 | |
| JP | S61164632 | A | 7/1986 | |
| JP | 2011080169 | A | 4/2011 | |
| JP | 2013136480 | A | 7/2013 | |
| JP | 5334278 | B1 | 11/2013 | |
| KR | 20110072917 | A | 6/2011 | |
| KR | 20110101347 | A | 9/2011 | |
| KR | 20110119270 | A | 11/2011 | |
| KR | 20120039799 | A | 4/2012 | |
| KR | 20120049679 | A | 5/2012 | |
| KR | 20130004638 | A | 1/2013 | |
| KR | 20130008782 | A | 1/2013 | |
| KR | 20130060661 | A | 6/2013 | |
| KR | 20130083128 | A | 7/2013 | |
| KR | 20130132211 | A | 12/2013 | |
| WO | WO-2014053510 | A1 * | 4/2014 | ............. C09C 1/44 |
| WO | WO-2014135455 | A1 * | 9/2014 | ............. B82Y 30/00 |

OTHER PUBLICATIONS

Mustafa Lotya et al: "Liquid Phase Production of Graphene by Exfoliation of Graphite in Surfactant/Water Solutions", Journal of The American Chemical Society, vol. 131, No. 10, Mar. 18, 2009 (Mar. 18, 2009), pp. 3611-3620, XP055062091, ISSN: 0002-7863, DOI: 10.1021/ja807449u * p. 3620, left-hand column, paragraph 2.
International Search Report from PCT/KR2014/012640, dated Apr. 14, 2015.
Lee, Dong-Woo, et al., "An amphilphilic pyrene sheet for selective functionalization of graphene." Chem. Commun., 2011, vol. 47, pp. 8259-9261.
Du, Wencheng et al., "From graphite to graphene: direct liquid-phase exfoliation of graphite to produce single- and few-layered pristine graphene." Journal of Materials Chemistry A., E-pub. Jul. 15, 2013, vol. 1, pp. 10592-10606.
Luo, Peicheng, et al., "Dispersion of single-walled carbon nanotubes by intense turbulent shear in micro-channels," Carbon, E-pub. Nov. 25, 2013, vol. 68, pp. 610-618.
Liang, Shuaishuai et al., "One-step green synthesis of graphene nanomesh by fluid-based method." The Royal Society of Chemistry, E-pub. Apr. 2, 2014, vol. 4, pp. 16127-16131.
Yi, Min, et al., "A fluid of dynamics route for producing graphene and its analogues." Chinese Science Bulletin, E-pub. Apr. 4, 2014, vol. 59, pp. 1794-1799.

* cited by examiner

[FIG. 1]
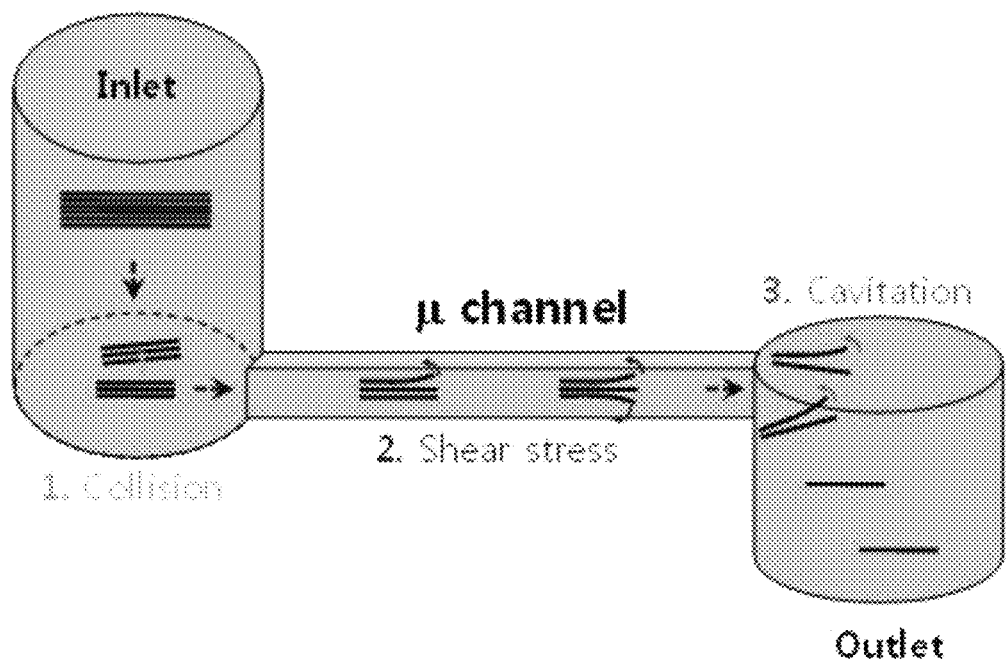

[FIG. 2A]
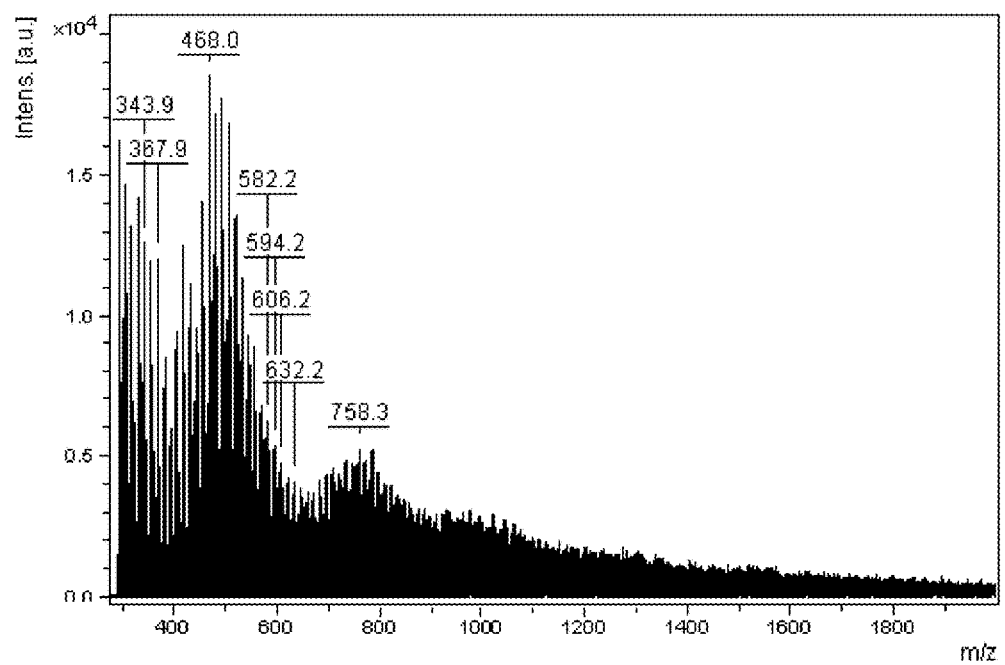

[FIG. 2B]
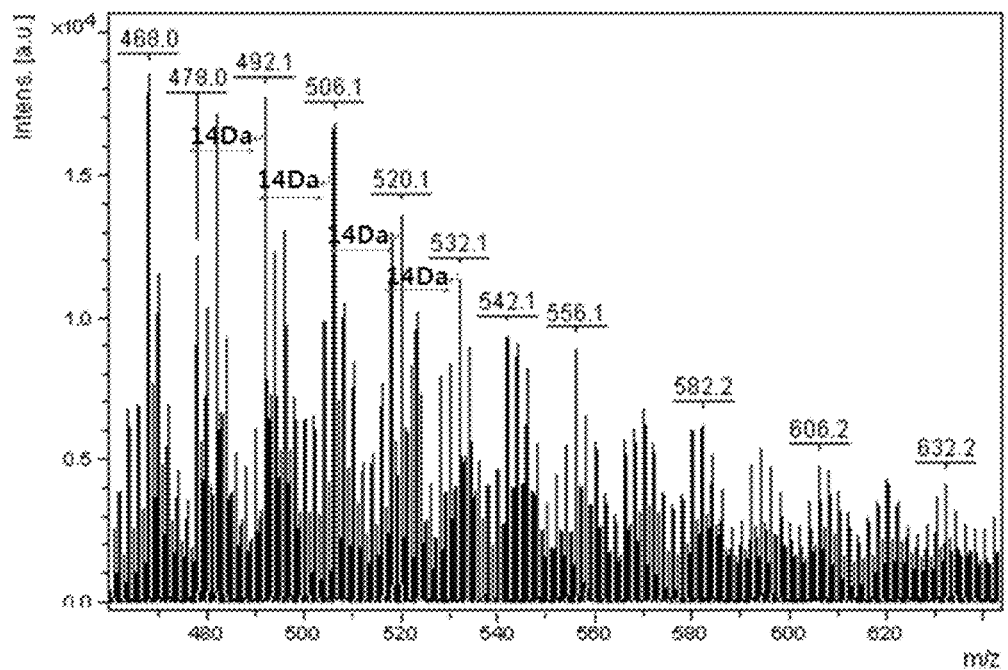
[FIG. 3A]
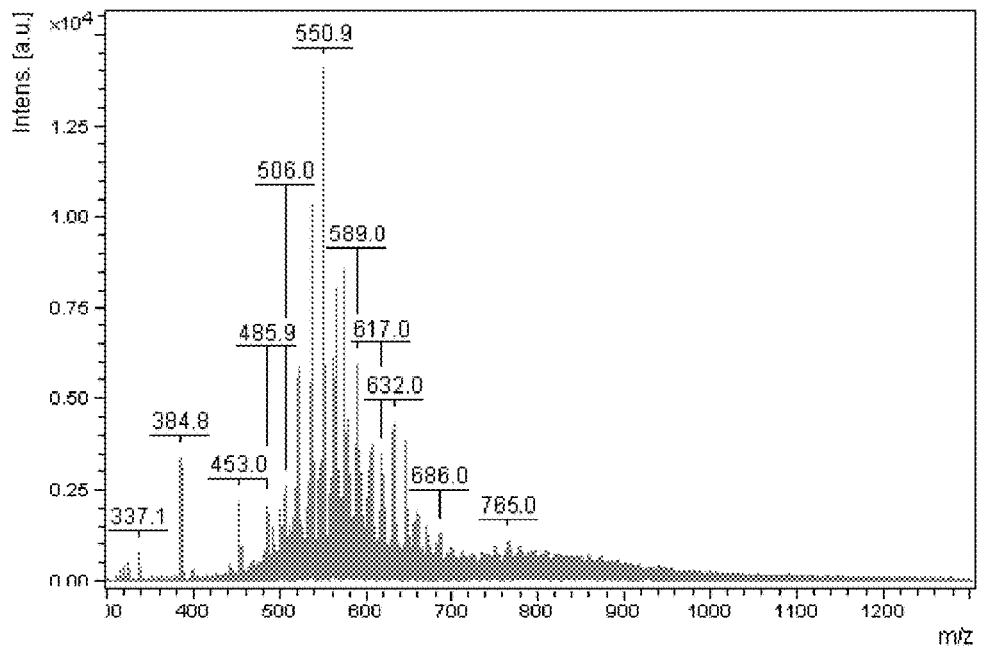

[FIG. 3B]
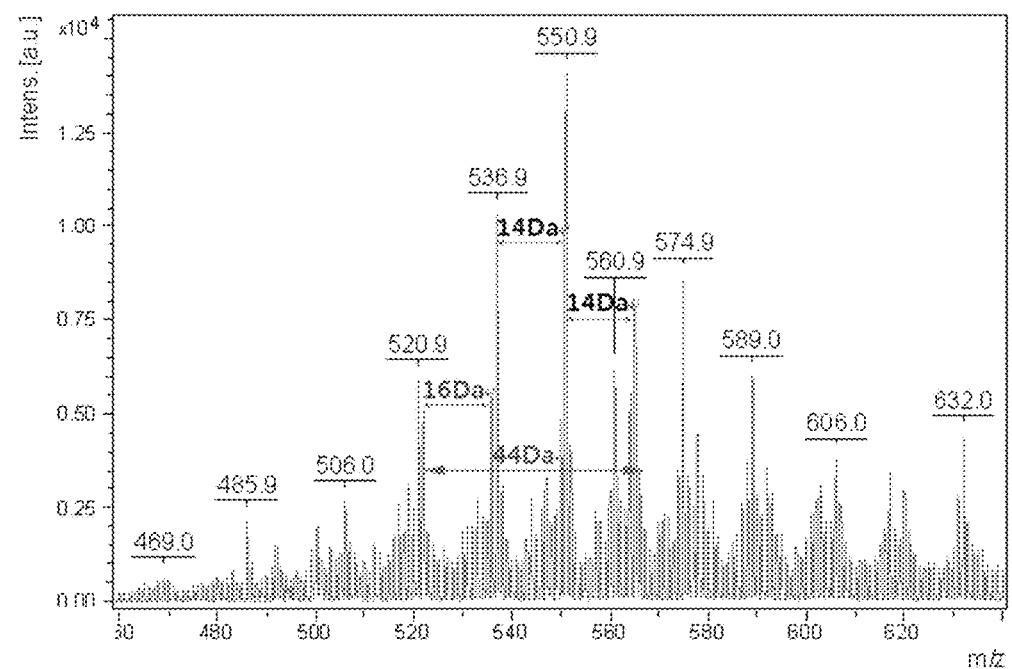
[FIG. 4]
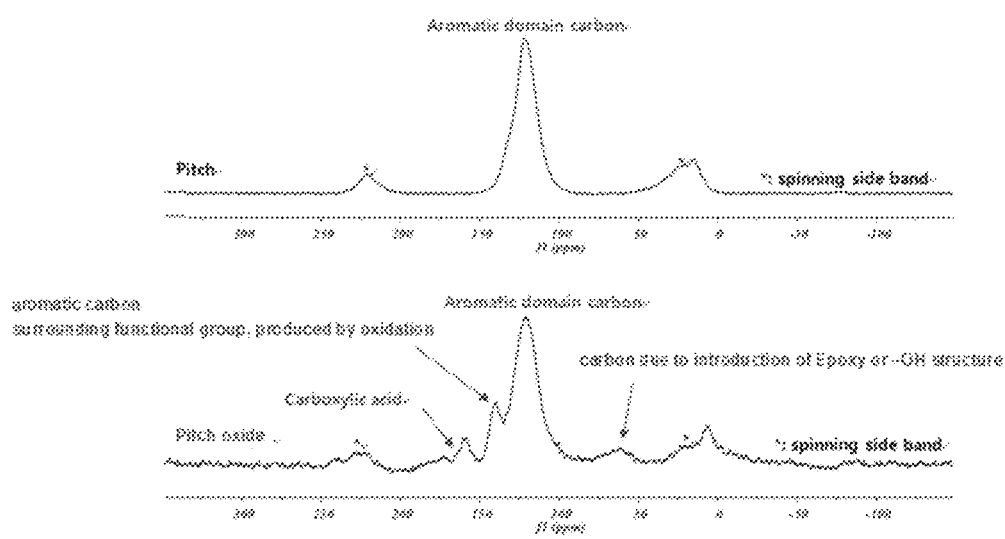

[FIG. 5]
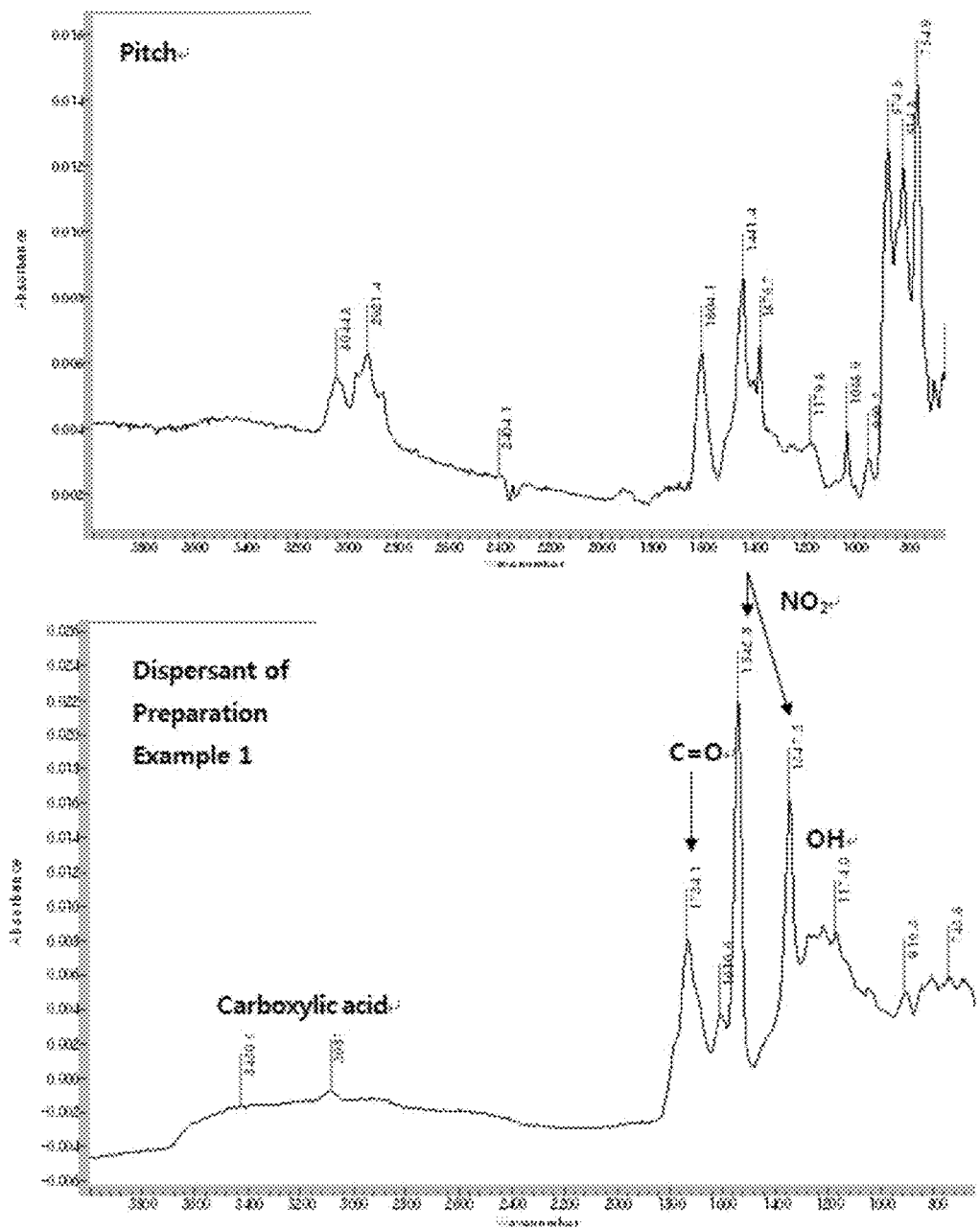

[FIG. 6]
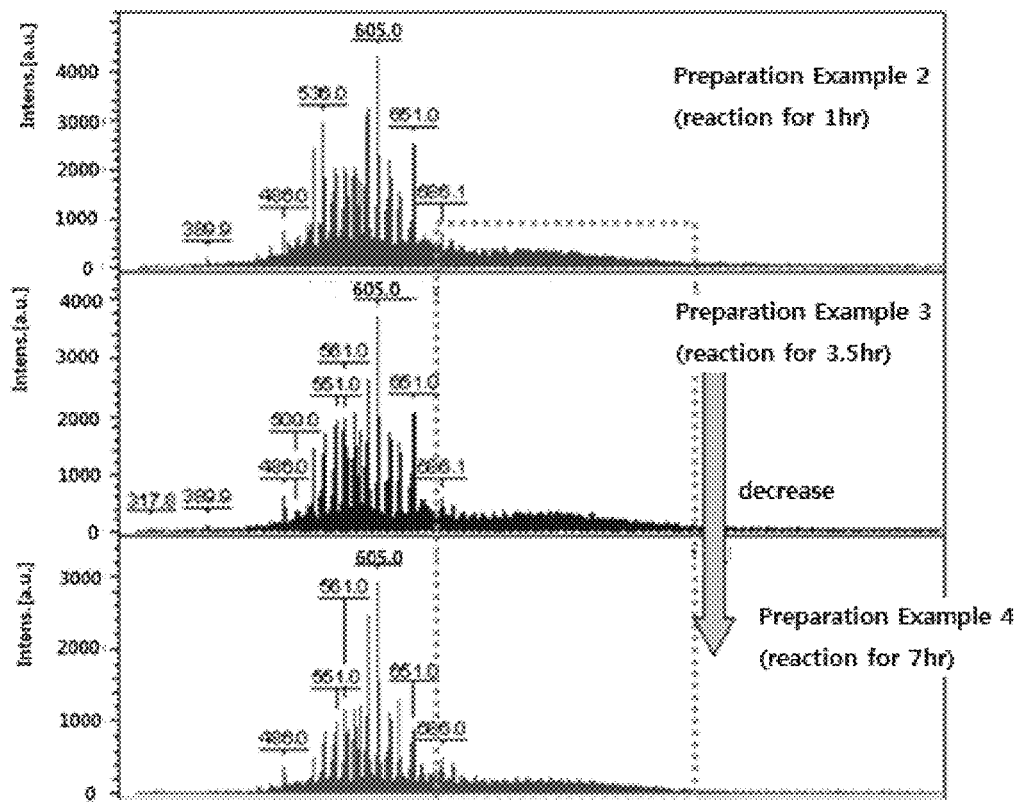

[FIG. 7]
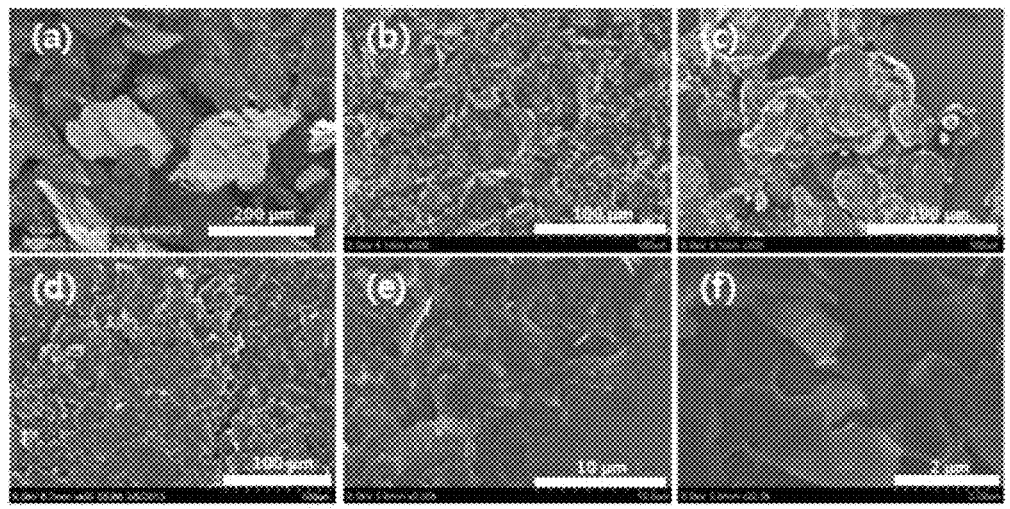
[FIG. 8]
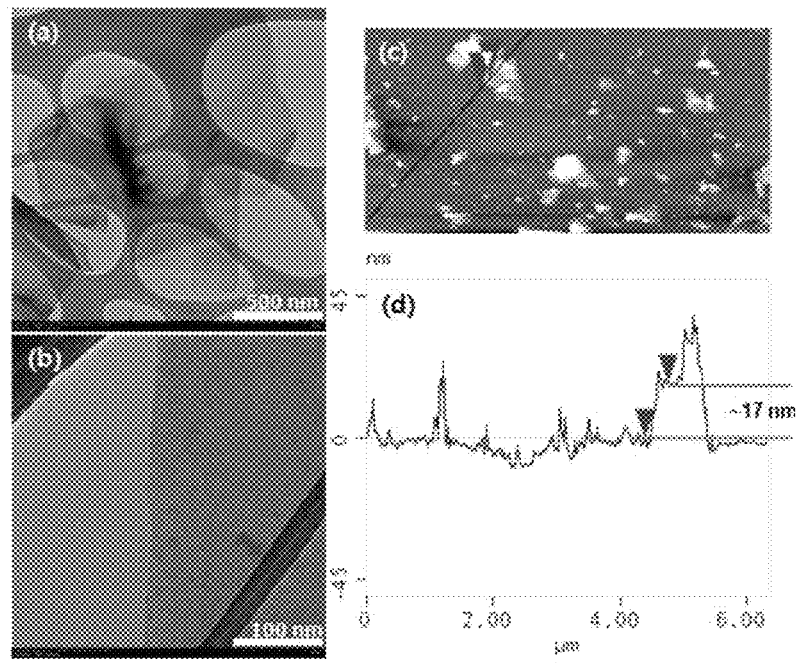

[FIG. 9]
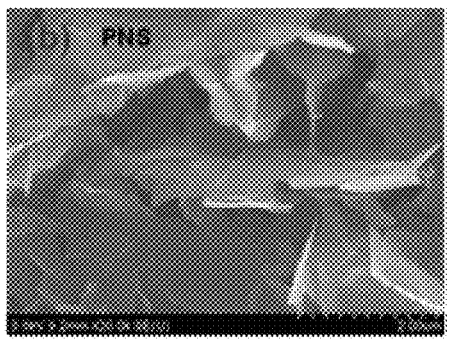
[FIG. 10]
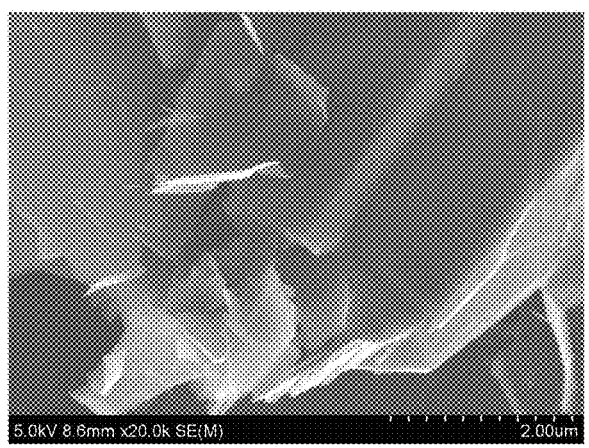
[FIG. 11]
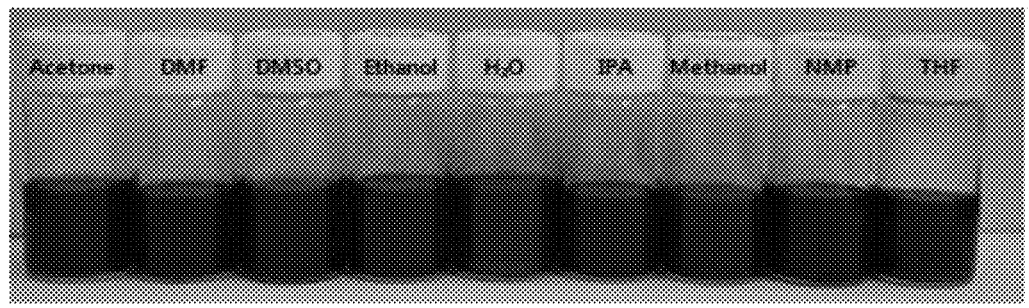

[FIG. 12]
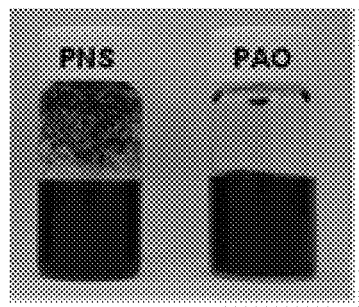
[FIG. 13]
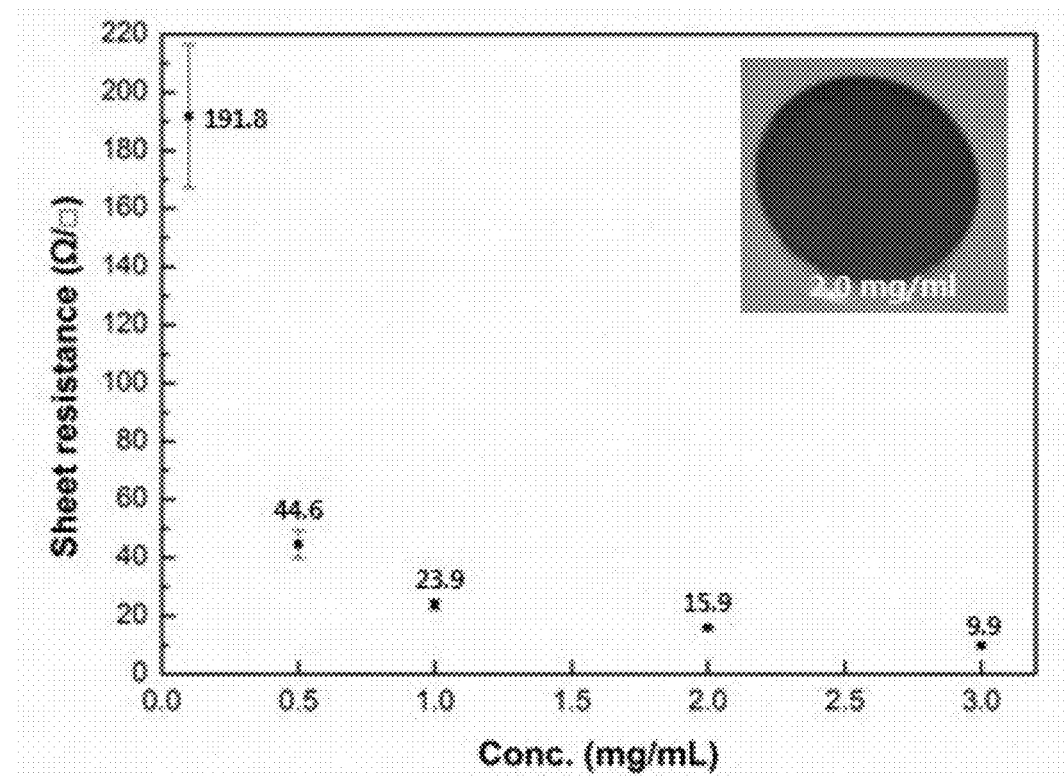

[FIG. 14]
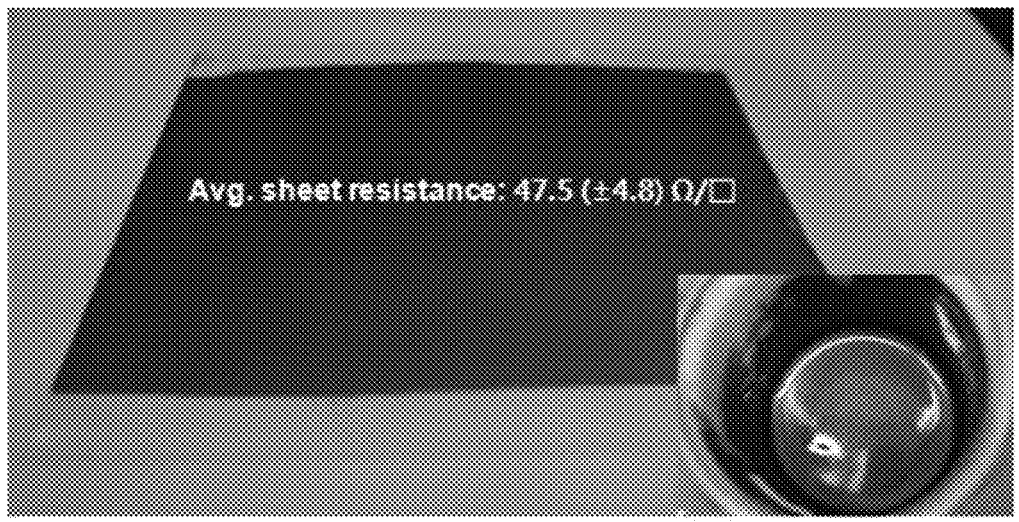

PREPARATION METHOD OF GRAPHENE AND DISPERSED COMPOSITION OF GRAPHENE

CROSS REFERENCE TO RELATED APPLICATION

This application is a national phase entry under 35 U.S.C. § 371 of International Application No. PCT/KR2014/012640, filed Dec. 22, 2014, which claims priority to Korean Patent Application No. 10-2013-0164671, filed Dec. 26, 2013 and Korean Patent Application No. 10-2014-0184902, filed Dec. 19, 2014, the disclosures of which are incorporated herein by reference.

TECHNICAL FIELD

The present invention relates to a preparation method of graphene, capable of easily preparing a graphene flake having a smaller thickness and a large area, and a dispersed composition of graphene obtained using the same.

BACKGROUND

Generally, graphene is a semi metallic material where carbon atoms form an arrangement connected in a hexagonal shape by two-dimensional sp2 bonding while having a thickness corresponding to a carbon atom layer. Recently, it has been reported that the properties of a graphene sheet having one carbon atomic layer were evaluated, and as a result, the graphene sheet may show very excellent electrical conductivity of electron mobility of about 50,000 cm2/Vs or more.

Further, graphene has the properties of structural and chemical stability and excellent thermal conductivity. In addition, graphene is consisting of only carbon which is a relatively light element, and thus, easy to be processed in one-dimensional or two-dimensional nanopatterns. Most of all, the graphene sheet is inexpensive materials and has excellent price competitiveness, as compared with existing nanomaterials.

Due to such electrical, structural, chemical and economical properties, graphene is expected to replace a silicon-based semiconductor technology and a transparent electrode in the future, and especially, is possible to be applied to a flexible electronic device field due to excellent mechanical properties.

Due to the numerous advantages and excellent properties of the graphene, various methods capable of more effective mass production of the graphene from carbon-based materials such as graphite, have been suggested or studied. Particularly, a method capable of easy preparation of a graphene sheet or flake having a smaller thickness and a large area has been studied in various ways, so that excellent properties of the graphene are more dramatically expressed. The existing methods of preparing graphene as such include the following:

First, a method wherein a graphene sheet is exfoliated from graphite by a physical method such as using a tape, is known. However, such method is not suitable for mass production, and has a very low exfoliation yield.

Further, another method wherein graphite is exfoliated by a chemical method such as oxidation, or acid, base, metal, and the like are inserted between the graphite carbon layers to obtain graphene or an oxide thereof which is exfoliated from an intercalation compound, is known. However, the former method may generate a number of defects on finally prepared graphene, in the course of obtaining graphene by proceeding with exfoliating by oxidation of graphite, and reducing a graphene oxide obtained therefrom again to obtain graphene. This may adversely affect the properties of finally prepared graphene. Further, the latter method also requires further processes such as using and treating the intercalation compound, and thus, the overall process is complicated, the yield is insufficient, and the economics of the process may be poor. Moreover, it is not easy to obtain a graphene sheet or flake having a large area in such a method.

Due to the problems of those methods, recently, a method of preparing graphene by exfoliating carbon layers contained in graphite by a milling method using ultrasonic irradiation, a ball mill or the like, in a state where graphite and the like are dispersed in liquid, is applied the most. However, such methods also had problems of being difficult to obtain graphene having sufficiently small thickness and a large area, generating a number of defects on graphene in an exfoliating process, having an insufficient exfoliation yield, or the like.

This causes continuous demand for a preparation method of easily preparing a graphene sheet or flake having a smaller thickness and a large area in a higher yield.

SUMMARY OF THE INVENTION

The present invention provides a preparation method of graphene, capable of easily preparing a graphene flake having a smaller thickness and a large area.

Further, the present invention provides a dispersed composition of graphene including graphene flakes obtained from the preparation method, wherein the graphene is uniformly dispersed in a polar solvent in a high concentration.

An exemplary embodiment of the present invention provides a preparation method of graphene, including applying a physical force to dispersion of a carbon-based material including graphite or a derivative thereof, and a dispersant, wherein the dispersant includes a mixture of plural kinds of polyaromatic hydrocarbon oxides, containing the polyaromatic hydrocarbon oxides having a molecular weight of about 300 to 1000 in a content of about 60% by weight or more, and the graphite or the derivative thereof is formed into a graphene flake having a thickness in nanoscale under application of a physical force.

In the preparation method of graphene, the graphite or the derivative thereof may be one or more selected from the group consisting of graphite, expanded graphite, indeterminate graphite, planar graphite, artificial graphite, modified graphite having an intercalation compound inserted in a carbon interlayer, and carbon nanofiber.

Further, the dispersion may be dispersion where a carbon-based material and a dispersant are dissolved or dispersed in an aqueous solvent or a polar organic solvent.

Herein, the dispersant may have an oxygen content of about 12 to 50% by weight, based on the total element content, when the plural kinds of polyaromatic hydrocarbon oxides contained in the dispersant are subjected to elemental analysis. Further, the polyaromatic hydrocarbon oxides contained in the dispersant may have a structure where one or more oxygen-containing functional groups are bonded to an aromatic hydrocarbon containing 5 to 30, or 7 to 20 benzene rings.

Further, in the preparation method of graphene, the applying of the physical force may be carried out by a method using a high speed homogenizer, a high pressure homogenizer, a ball mill, a bead mill or an ultrasonic irradiator.

The graphene flake formed in the preparation method of graphene may have a thickness of about 1.5 to 50 nm, or about 5 to 30 nm, a diameter of about 0.1 to 10 μm, or about 0.1 to 5 μm, and a diameter/thickness ratio of about 50 to 6000, or about 50 to 1000.

Further, the graphene flake may be formed in a state where the dispersant is physically attached to a surface of the graphene flake.

Meanwhile, the preparation method of graphene may further include recovering graphene flakes from the dispersion of the graphene flakes and drying, wherein the recovering may proceed by centrifugation, vacuum filtration or pressure filtration. Further, the drying may proceed by vacuum drying at a temperature of about 30 to 200° C.

Another exemplary embodiment of the present invention provides a dispersed composition of graphene including the graphene flakes obtained from the preparation method as described above, wherein the graphene flakes are uniformly dispersed in a polar solvent in a high concentration. The dispersed composition of graphene may include graphene flakes to the surface of which a dispersant including a mixture of plural kinds of polyaromatic hydrocarbon oxides, containing the polyaromatic hydrocarbon oxides having a molecular weight of about 300 to 1000 in a content of about 60% by weight or more, is physically attached; and a polar solvent dissolving or dispersing the graphene flakes.

Such dispersed composition may be prepared by forming graphene flakes to the surface of which the dispersant is physically attached through the above described preparation method, and then directly (or continuously) dissolving or dispersing the graphene flakes in a polar solvent, without additional treatment for improving their dispersibility.

In addition, in the dispersed composition, the polar solvent may include one or more selected from the group consisting of water, NMP, acetone, DMF, DMSO, ethanol, isopropyl alcohol, methanol, butanol, 2-ethoxy ethanol, 2-butoxy ethanol, 2-methoxy propanol, THF, ethylene glycol, pyridine, dimethylacetamide, N-vinyl pyrrolidone, methyl ethyl ketone, butanone, α-terpinol, formic acid, ethyl acetate and acrylonitrile.

Further, in the dispersed composition, the graphene flakes to the surface of which the dispersant is physically attached may be included in about 50 parts by weight or less, based on 100 parts by weight of the polar solvent.

The dispersed composition of graphene may be used as a conductive paste composition, a conductive ink composition, a composition for forming a heat dissipation substrate, an electrically conductive composite, a composite for EMI shielding, or a conductive material for a battery.

Advantageous Effects

According to the present invention, graphene flakes may be prepared by effectively exfoliating graphite or a derivative thereof as a raw material in a state of being more uniformly dispersed, due to the use of a certain dispersant and the optimization of an exfoliating method. Therefore, according to the present invention, graphene flakes having a smaller thickness and a large area may be easily prepared in a high yield.

Moreover, the graphene flake prepared according to the method of the present invention may show very excellent dispersibility to various polar solvents per se, without additional treatment for improving its dispersibility or solubility. Therefore, a dispersed composition of graphene including the graphene flakes may be very effectively used in various fields and uses such as a conductive paste composition, a conductive ink composition, a composition for forming a heat dissipation substrate, an electrically conductive composite, a composite for EMI shielding, a conductive material for a battery, or the like.

BRIEF DESCRIPTION OF DRAWINGS

FIG. 1 is an outlined schematic view showing a principle of high pressure homogenizer usable in a preparation method of graphene of an exemplary embodiment.

FIGS. 2A and 2B (enlarged views in a range of molecular weight of 400 to 500) are drawings showing molecular weight distribution of pitch used for preparation of a dispersant in the Preparation Examples by analyzing it by a MALDI-TOF mass spectrum.

FIGS. 3A and 3B (enlarged views in a range of molecular weight of 400 to 500) are drawings showing molecular weight distribution of a dispersant obtained in Preparation Example 1 by analyzing it by a MALDI-TOF mass spectrum.

FIG. 4 is a drawing showing the analysis results, after analyzing pitch and a dispersant of Preparation Example 1 by a 13C CPMAS NMR, respectively.

FIG. 5 is a drawing showing the analysis results, after analyzing pitch and a dispersant of Preparation Example 1 by a FT-IR, respectively.

FIG. 6 is a drawing showing comparison of the analysis results, after analyzing molecular weight distributions of dispersants each of which is obtained in Preparation Examples 2 to 4 by a MALDI-TOF mass spectrum.

FIG. 7 is a micrograph of graphite used as a raw material for preparation of graphene flakes of the Examples (a), and micrographs of graphene flakes each of which is prepared in Examples 1 to 4 (b to f).

FIG. 8 shows TEM analysis results (a and b), and AFM analysis results (c and d), for measuring a diameter and a thickness of a graphene flake of Example 4, respectively.

FIGS. 9 and 10 are micrographs of graphene flakes each of which is prepared in Comparative Examples 1 and 2.

FIG. 11 is a visually observed photograph showing evaluation results of redispersibility by redispersing graphene flakes obtained in Example 4 in various solvents, in Experimental Example 2.

FIG. 12 is a visually observed photograph showing evaluation results of redispersibility by redispersing graphene flakes obtained in Comparative Example 1 in water as a polar solvent, as compared with Example 4, in Experimental Example 2.

FIG. 13 is a graph showing measurement results of sheet resistance of a graphene film, after preparing the graphene film using graphene flakes of Example 4, in Experimental Example 3.

FIG. 14 is a drawing showing measurement results of sheet resistance of a film with appearance of the formed film, after preparing a paste composition using graphene flakes of Example 4, and coating the composition on a PET substrate to form the film.

DETAILED DESCRIPTION OF EMBODIMENTS

Hereinafter, a preparation method of graphene according to an exemplary embodiment of the present invention, and a dispersed composition of graphene will be described in detail.

Some of the terms used herein may be defined as follows.

First, hereinafter, a "dispersant" refers to any component for uniformly dispersing other components, for example, a carbon-based material such as graphite or a derivative thereof, graphene (flake), or the like within an aqueous solvent, an organic solvent, or other liquid medium. A composition in which other components to be subjected to dispersion such as the "dispersant" and the carbon-based material are dispersed within a liquid medium, may be referred to as a "dispersed composition", and such "dispersed composition" may be present in different states such as a liquid state, a slurry state or a paste state. Further, such "dispersed composition" may be used in various applications such as a conductive material composition for a secondary battery and the like; a composition for electrode or conductive composition applied in the manufacturing process of various batteries, displays, devices, or the like; an active material composition for a secondary battery and the like; a composition for preparing various polymers or resin composites; or an ink or paste composition applied in the manufacturing process of various electronic materials, devices, or the like; or the like, and the use thereof is not particularly limited. If only the "dispersant" and a component to be subjected to dispersion are included together within a liquid medium, such case may be defined as belonging to a category of the "dispersed composition", regardless of the state or use thereof.

Further, hereinafter, "polyaromatic hydrocarbon" may refer to an aromatic hydrocarbon compound in which aromatic rings, for example, two or more, or five or more benzene rings are bonded to and contained in a single compound structure. Further, "polyaromatic hydrocarbon oxide" may refer to any compound in which one or more oxygen-containing functional group are bonded within the chemical structure, by the reaction of the above described "polyaromatic hydrocarbon" with an oxidant. Herein, the oxygen-containing functional group to be introduced to the "polyaromatic hydrocarbon" by the reaction with the oxidant may be any functional group which may be bonded to the aromatic ring, and contains one or more oxygens in the functional group, such as a hydroxy group, an epoxy group, a carboxy group, a nitro group or sulphonic acid.

Further, hereinafter, a "carbon-based material" may refer to any material mainly containing a carbon-carbon bond, for example, graphite or a derivative thereof, such as graphene, carbon nanotube and graphite, carbon black, fullerene represented by C60, or other similar fullerene-based materials or a derivative thereof, or the like, inclusively. However, it may be interpreted that the "polyaromatic hydrocarbon" or the oxides thereof which is a main component or a main raw material of the "dispersant" in the present invention, does not belong to the category of such "carbon-based materials".

In addition, hereinafter, a certain component such as a dispersant being "physically attached" to a surface of another component such as a graphene flake, may refer to a certain component existing in a state of being fixed to a surface of another component by bonding, attachment, adsorption or at least partly embedding, only by a physical force, without being mediated by a chemical bond such as a covalent bond or a coordination bond between the two components.

Meanwhile, according to an exemplary embodiment of the present invention, a preparation method of graphene including applying a physical force to dispersion of a carbon-based material including graphite or a derivative thereof, and a dispersant, wherein the dispersant includes a mixture of plural kinds of polyaromatic hydrocarbon oxides, containing the polyaromatic hydrocarbon oxides having a molecular weight of 300 to 1000 in a content of 60% by weight or more, and the graphite or the derivative thereof is formed into a graphene flake having a thickness in nanoscale under application of a physical force, is provided.

The preparation method of graphene of an exemplary embodiment may include uniformly dispersing graphite or a derivative thereof such as graphite in an aqueous solvent or a polar organic solvent, in the presence of a certain dispersant, and then applying a physical force to the dispersion for exfoliation.

According to the preparation method of an exemplary embodiment, graphite or a derivative thereof may be exfoliated in a state of being dispersed more uniformly by the action of a certain dispersant as described below, thereby preparing graphene flakes. Further, though it will be described in detail hereinafter, the process of proceeding with exfoliating by applying a physical force to the graphite or the derivative thereof may be more optimized by a method of using a high pressure homogenizer and the like.

Consequently, in the preparation method of an exemplary embodiment, graphene flakes may be prepared by proceeding with exfoliating more efficiently, in a state where the dispersion of graphite or a derivative thereof as a raw material is optimized. As result, according to an exemplary embodiment, graphene flakes having a smaller thickness and a large area may be easily prepared in high yield.

In addition, as the graphene flake prepared according to the method of an exemplary embodiment is present in a state where a dispersant is physically attached to the surface of the graphene flake, it may show very excellent dispersibility to various polar solvents per se, without additional treatment for improving its dispersibility or solubility. Therefore, a dispersed composition of graphene including the graphene flakes may be very effectively used in various fields and uses such as a conductive paste composition, a conductive ink composition, a composition for forming a heat dissipation substrate, an electrically conductive composite, a composite for EMI shielding, a conductive material for a battery, or the like.

Meanwhile, since excellent effects according to an exemplary embodiment may be expressed by the use of a certain dispersant, hereinafter, first, the dispersant will be described in detail, and then a preparation method of graphene of an exemplary embodiment using the dispersant will be described in detail.

The dispersant used in the method of an exemplary embodiment may include a mixture of plural kinds of polyaromatic hydrocarbon oxides, containing the polyaromatic hydrocarbon oxides having a molecular weight of about 300 to 1000 in a content of about 60% by weight or more.

Pitch which is discharged as a residue and the like in a refining process of fossil fuels such as petroleum or coal, is a byproduct used for asphalt production, and the like, and may be formed as a viscous mixture containing plural kinds of polyaromatic hydrocarbons having a plurality of aromatic rings. However, as a result of the present inventor's experiment, it was confirmed that if such pitch and the like undergo an oxidation process using an oxidant, among polyaromatic hydrocarbons contained in the pitch, polyaromatic hydrocarbons having excessively large molecular weight are at least partly decomposed, and a mixture of polyaromatic hydrocarbons having a relatively narrow molecular weight distribution is obtained. In addition, it was confirmed that as one or more oxygen-containing functional groups are introduced to the aromatic ring of each polyaromatic hydrocarbon, a mixture containing plural kinds of polyaromatic hydrocarbon oxides is obtained.

Specifically, a mixture of polyaromatic hydrocarbon oxides obtained in this method was confirmed to contain polyaromatic hydrocarbon oxides having a molecular weight of about 300 to 1000, or about 300 to 700 in about 60% by weight or more, or about 65% by weight or more, or about 70 to 95% by weight, as analyzed by MALDI-TOF MS. Specific kinds, structure, distribution and the like of the polyaromatic hydrocarbon oxides contained in the mixture may be varied depending on the kind or origin of the pitch as a raw material, the kind of an oxidant, or the like. However, at least, the mixture of the polyaromatic hydrocarbon oxides included in the dispersant contains plural kinds of polyaromatic hydrocarbon oxides having a structure where one or more oxygen-containing functional groups are introduced to each polyaromatic hydrocarbon having 5 to 30, or 7 to 20 benzene rings, respectively, and the polyaromatic hydrocarbon oxides in the mixture have the above-described molecular weight distribution, that is, a molecular weight distribution where oxides having a molecular weight of about 300 to 1000, or about 300 to 700 are contained in about 60% by weight or more, based on the total compound.

Herein, the kind of the oxygen-containing functional group may be varied depending on the kind of an oxidant used in an oxidation process of pitch and the like, but may be one or more selected from the group consisting of for example, a hydroxy group, an epoxy group, a carboxy group, a nitro group and sulphonic acid, and within the mixture of the polyaromatic hydrocarbon oxides, various polyaromatic hydrocarbon oxides having plural kinds of various functional groups selected among the functional groups mentioned above, may be contained and mixed.

The polyaromatic hydrocarbon oxides satisfying the above-described structural feature, the molecular weight distribution and the like, and the mixture thereof may have both a hydrophobic π-domain gathering aromatic rings, and a hydrophilic region by the oxygen-containing functional groups bonded to the aromatic ring and the like, at the same time. Among these, the hydrophobic π-domain may π-π interact with a surface of the carbon-based material in which carbon-carbon bonds are formed such as graphite or a derivative thereof, or graphene (flake), and the hydrophilic region may express repulsion between each single carbon-based material (for example, each particle of each graphene flake, graphite or a derivative thereof). As a result, the above-described dispersant including the mixture of the polyaromatic hydrocarbon oxides may be present between the molecules of the carbon-based material in a liquid medium such as an aqueous solvent or a polar organic solvent, and uniformly disperse the carbon-based material. Therefore, it was confirmed that the dispersant may represent an excellent dispersion force to uniformly disperse the carbon-based material in a higher concentration even in the case of using relatively small amount.

Moreover, since the above-described dispersant represents water-solubility per se due to the presence of a hydrophilic region by the oxygen-containing functional group and the like, it may uniformly disperse the carbon-based material even in an environmentally friendly aqueous solvent. Particularly, the dispersant was confirmed to represent an excellent dispersion force to uniformly disperse the carbon-based material in a high concentration, in various polar organic solvents, as well as an environmentally friendly aqueous solvent.

Especially, it was confirmed that it is difficult to achieve an excellent dispersion force as described above by only using separated one or two kinds of the compounds itself of the polyaromatic hydrocarbon oxides, and it may be achieved by using the mixture of plural kinds of polyaromatic hydrocarbon oxides satisfying the above-described molecular weight distribution (molecular weight range and content range). Such excellent dispersion force was caused by the above-described dispersant in the form of a mixture of plural kinds of polyaromatic hydrocarbon oxides including plural kinds of components and having a broad molecular weight distribution, and even in case of using a very small amount of the dispersant, a dispersion effect equivalent to the use of the one or two separated compounds may be achieved, due to such excellent dispersion force. This may result in an effect of greatly reducing a remaining amount of the dispersant acting as a kind of an impurity to be removed later from a component to be subjected to dispersion.

Further, due to the excellent dispersion force of the dispersant, in the preparation method of an exemplary embodiment, graphite or a derivative thereof as a raw material may be more uniformly dispersed in a high concentration. Therefore, by exfoliating the raw material in a state of being optimally dispersed, this may be one of main factors allowing easy preparation of a graphene flake having a smaller thickness and a large area. Moreover, since the dispersant may be maintained in a state of being physically attached to the surface of a finally formed graphene flake, the graphene flake prepared in the method of an exemplary embodiment may represent excellent dispersibility in various polar solvents, and the like per se.

Meanwhile, the above-described dispersant may have an oxygen content in the total mixture of about 12 to 50% by weight, or about 15 to 45% by weight, based on the total element content, when the plural kinds of polyaromatic hydrocarbon oxides contained in the dispersant are subjected to elemental analysis. Such oxygen content reflects a degree of the introduction of the oxygen-containing functional group by an oxidation process in the polyaromatic hydrocarbon oxides, and as the oxygen content is satisfied, the above-described hydrophilic region may be included in an appropriate degree. As a result, in the above-described method of an exemplary embodiment, graphite or a derivative thereof as a raw material may be more uniformly dispersed using the dispersant; a graphene flake having a small thickness may be more effectively obtained therefrom; and the dispersibility of the finally prepared graphene flakes may be more improved.

The oxygen content may be calculated by elemental analysis of the plural kinds of polyaromatic hydrocarbon oxides contained in the above-described mixture. That is, when a sample of the mixture (for example, about 1 mg) is, for example, heated to a high temperature of about 900° C. around on a thin foil, the foil is instantaneously melted so that the temperature is raised to about 1500 to 1800° C., and by such high temperature, gas is generated from the mixture sample, thereby collecting generated gas, and measuring and analyzing the element content thereof. As a result of the elemental analysis, total element contents of carbon, oxygen, hydrogen and nitrogen contained in the plural kinds of polyaromatic hydrocarbon oxides may be measured and analyzed, and the oxygen content to the total element content may be calculated.

Meanwhile, the above-described dispersant may be prepared by a method including oxidizing the mixture containing polyaromatic hydrocarbon having a molecular weight of about 200 to 1500.

As already described above, pitch discharged as a residue in the refining process of fossil fuels such as petroleum or coal, may contain plural kinds of polyaromatic hydrocarbon, and be in a mixture state of being viscous or in a powder form. Of course, the specific kinds, structure, compositional ratio or molecular weight distribution of the polyaromatic hydrocarbon may be varied depending on the raw material or origin of the pitch, however, the pitch may include plural kinds of polyaromatic hydrocarbons containing for example, 5 to 50 aromatic rings, for example, benzene rings in the structure, and largely include polyaromatic hydrocarbons having a molecular weight of about 200 to 1500. For example, a mixture including polyaromatic hydrocarbons having a molecular weight of about 200 to 1500 (e.g., pitch), used as a starting material in a method of preparing the dispersant, may include the polyaromatic hydrocarbons in such molecular weight range in a content of about 80% by weight or more, or about 90% by weight or more.

However, if a mixture including polyaromatic hydrocarbons, such as the pitch undergoes an oxidation process using an oxidant, among polyaromatic hydrocarbons contained in the pitch, polyaromatic hydrocarbons having excessively large molecular weight may be decomposed, and a mixture of polyaromatic hydrocarbons having a relatively narrow molecular weight distribution may be obtained. For example, polyaromatic hydrocarbons having a molecular weight more than about 1000, or about 700 may be decomposed to those having a less molecular weight. In addition, as one or more oxygen-containing functional groups are also introduced to each aromatic ring of each polyaromatic hydrocarbon, a mixture including plural kinds of polyaromatic hydrocarbon oxides, that is, a dispersant used in the method of an exemplary embodiment may be very simply prepared.

In the method of preparing the dispersant, the kind of oxidant is not particularly limited, and any oxidant may be used without limitation, if only it causes an oxidation reaction to introduce an oxygen-containing functional group to an aromatic hydrocarbon. Specific example of the oxidant may include nitric acid ($HNO_3$), sulfuric acid ($H_2SO_4$), hydrogen peroxide ($H_2O_2$), ammonium cerium(IV) sulfate (($NH_4$)$4Ce(SO_4)_4$), ammonium cerium(IV) nitrate (($NH_4$)$_2$ $Ce(NO_3)_6$), or the like, and of course, a mixture of two or more selected therefrom may also be used.

Further, such oxidation process may proceed at a reaction temperature of about 10 to 110° C. for about 0.5 to 20 hours, in an aqueous solvent. As a specific example, the mixture containing the polyaromatic hydrocarbons may be added in a certain amount, in the presence of a liquid phase oxidant such as sulfuric acid and/or nitric acid, and the oxidation process may proceed at room temperature, for example, at about 20° C. or 80° C., for about 1 to 12 hours. As the reaction temperature, hour or the like in the oxidation process is controlled, the properties of the above-described dispersant, for example, an oxidation degree of the polyaromatic hydrocarbons may be properly adjusted to prepare a dispersant having desired properties.

Further, as described above, the mixture containing polyaromatic hydrocarbons having a molecular weight of about 200 to 1500, which is a starting material of the preparation method may be derived from pitch obtained from fossil fuels or a product thereof, and depending on the kind of the raw materials, the kind, structure or molecular weight distribution of the polyaromatic hydrocarbons may be different from each other. Nevertheless, as the mixture containing the polyaromatic hydrocarbons having a molecular weight of about 200 to 1500, derived from the pitch and the like undergoes the oxidation process, the above-described dispersant representing an excellent dispersion force to carbon-based materials may be simply prepared.

Meanwhile, in the preparation method as described above, a process of purifying the resulting product after the oxidation process to obtain the mixture of plural kinds of polyaromatic hydrocarbon oxides, may be further included, and such purification process may proceed by including a centrifugation process of the resulting product from the oxidation process. With such purification process, the mixture of the polyaromatic hydrocarbon oxides satisfying the above-described molecular weight distribution and the like may be obtained appropriately in a higher purity, and using the dispersant including the mixture, graphene flakes may be more effectively prepared by the method of an exemplary embodiment.

Meanwhile, in the preparation method of graphene according to an exemplary embodiment, first, dispersion including the above-described dispersant and a carbon-based material including graphite or a derivative thereof may be obtained.

Herein, the kind of the graphite or the derivative thereof, usable as the raw material is not particularly limited, and as the graphite or the derivative thereof has a three-dimensional structure in the form where carbon atomic layers are stacked, any carbon-based material to prepare graphene and the like having one or more carbon atomic layers by exfoliating it by any physical force such as high speed, high pressure, ultrasonic irradiation or shear force, may be used.

Therefore, in the category of the graphite or the derivative thereof, general graphite commonly referred to as graphite, and also any derivative which may be prepared therefrom, or any analog having a three-dimensional structure in the form where carbon atomic layers are stacked similarly are all included, and referred to as such. As a more specific example thereof, expanded graphite, indeterminate graphite, planar graphite, artificial graphite, modified graphite having an intercalation compound inserted in a carbon interlayer, carbon nanofiber or the like may be included, and a mixture of two or more selected from them may be used as the raw material, the graphite or the derivative thereof. Among these, in the case of the carbon nanofiber, the carbon nanofiber where carbon atomic layers forming the fiber is vertically arranged to the axial direction of the fiber may be used more appropriately, and graphene flakes may be prepared more preferably therefrom.

Further, the dispersion may be dispersion where a carbon-based material including graphite or a derivative thereof and a certain dispersant as already described, are dissolved or dispersed in an aqueous solvent or a polar organic solvent. Since this dispersion may be present in a state where the carbon-based material including graphite or a derivative thereof is very uniformly dispersed by the action of the certain dispersant, a subsequent exfoliating process may proceed in such an optimized dispersed state to effectively form a graphene flake having a smaller thickness and large area.

In addition, in the dispersion used as the raw material, the aqueous solvent or the polar organic solvent may include any aqueous solvent or polar organic solvent such as one or more selected from the group consisting of water, NMP, acetone, DMF, DMSO, ethanol, isopropyl alcohol, methanol, butanol, 2-ethoxy ethanol, 2-butoxy ethanol, 2-methoxy propanol, THF, ethylene glycol, pyridine, dimethylacetamide, N-vinyl pyrrolidone, methyl ethyl ketone, butanone, α-terpinol, formic acid, ethyl acetate and acrylonitrile.

Meanwhile, in the preparation method of graphene of an exemplary embodiment, after forming and providing the dispersion, a physical force may be applied to the dispersion to exfoliate the graphite or the derivative thereof, and graphene flakes may be prepared therefrom. Herein, the exfoliating process to apply a physical force may proceed by applying any method originally known to be applicable for preparation of graphene, and besides, various methods such as a method using a high pressure homogenizer may be applied.

As a specific example of the method, a method using a high speed homogenizer, a high pressure homogenizer, a ball mill, a bead mill, an ultrasonic irradiator or the like may be included. However, by a method using ultrasonic irradiation, graphene having a large area is difficult to be obtained, or a number of defects may be generated on the graphene in the exfoliating process, or an exfoliation yield may not be sufficient. In addition, also by a method of using a ball mill or a bead mill, graphene having sufficiently small thickness may be difficult to be obtained, and an exfoliation yield may also be insufficient.

Therefore, among those methods, a method using a high speed homogenizer or a high pressure homogenizer may be applied more appropriately, and most appropriately, a method using a high pressure homogenizer may be applied. FIG. 1 is an outlined schematic view showing a principle of high pressure homogenizer usable in a preparation method of graphene of an exemplary embodiment.

Referring to FIG. 1, the high pressure homogenizer may have an inlet of raw materials, an outlet of a product resulting from exfoliating such as graphene flakes, and a micro-channel for connection between the inlet and the outlet, having a diameter in a micrometer scale. Through the inlet of the high pressure homogenizer, for example, high pressure of about 100 to 3000 bar is applied, while a raw material in the state of dispersion including graphite or a derivative thereof is introduced, and then the raw material is passed through the micro-channel in a micron scale (μm), for example, having a diameter of about 10 to 800 μm, thereby applying high shear force to the raw material. By the action of the shear force, the graphite or the derivative thereof may be very effectively exfoliated, and as a result, it was confirmed that a graphene flake having a very small thickness and a large area may be prepared by synergy with the above-described dispersant.

Therefore, in the method of an exemplary embodiment, the method of using the high pressure homogenizer may be applied, thereby more effectively and easily preparing the graphene flake having a small thickness and a larger area corresponding to a carbon atomic layer, as compared with other methods.

Meanwhile, the above-described preparation method of graphene of an exemplary embodiment may further include recovering graphene flakes from the dispersion of the graphene flakes and drying, wherein the recovering may proceed by centrifugation, vacuum filtration or pressure filtration. Further, the drying may proceed by vacuum drying at a temperature of about 30 to 200° C.

According to the method of an exemplary embodiment, a graphene flake having a very large area (diameter) and a very small thickness corresponding to a carbon atomic layer thickness may be easily prepared in a high yield.

For example, the graphene flake may have a thickness of about 1.5 to 50 nm, or about 5 to 30 nm, and a large diameter of about 0.1 to 10 μm, or about 0.1 to 5 μm. Further, the graphene flake may have a very large area (diameter) to thickness, that is, a diameter/thickness ratio of about 50 to 6000, or about 50 to 1000. Herein, the "diameter" of the graphene flake may be defined as "the longest distance of straight-line distances connecting any two points on a plane of each particle, when each particle of the graphene flakes is viewed in the plane having the largest area".

As such, as the graphene flake having a smaller thickness and a large area is prepared by the method of an exemplary embodiment, such graphene flake may express excellent electrical conductivity, thermal conductivity and stability of the graphene, in a more maximized manner.

Further, the graphene flake may be formed in a state where the above-described dispersant is physically attached to a surface of the graphene flake. Due to the physical attachment of the dispersant, the graphene flake may directly represent very excellent dispersibility to various polar solvents, without the need of additional treatment or a process in progress. That is, the existing graphene flake generally has very poor dispersibility to at least some solvent, and thus, in order to utilize it, additional treatment for improving dispersibility should proceed or the use of additional dispersant and the like is needed, whereas the graphene flake prepared by the method of an exemplary embodiment may directly represent excellent dispersibility to various polar solvents, without the need of such additional treatment, and the like.

Therefore, the graphene flake prepared by the method of an exemplary embodiment may be directly (continuously) redispersed in various polar solvents, thereby being utilized in various application such as a conductive paste composition, a conductive ink composition, a composition for forming a heat dissipation substrate, an electrically conductive composite, a composite for EMI shielding, or a conductive material for a battery.

Thus, according to another exemplary embodiment of the present invention, a dispersed composition of graphene including the above-described graphene flakes, is provided. The dispersed composition of graphene may include graphene flakes to the surface of which the above-described certain dispersant, that is, a dispersant including a mixture of plural kinds of polyaromatic hydrocarbon oxides, containing the polyaromatic hydrocarbon oxides having a molecular weight of about 300 to 1000 in a content of about 60% by weight or more, is physically attached; and a polar solvent dissolving or dispersing the graphene flakes.

As already described, such dispersed composition may be prepared by forming graphene flakes to the surface of which the dispersant is physically attached through the above described preparation method, and then directly (or continuously) dissolving or dispersing the graphene flakes in a polar solvent, without additional treatment for improving their dispersibility.

Further, in the dispersed composition, as the polar solvent for dispersing the graphene flakes, an aqueous solvent such as water, or any polar solvent may be applied without particular limitation. As a specific example of the polar solvent, one or more selected from the group consisting of water, NMP, acetone, DMF, DMSO, ethanol, isopropyl alcohol, methanol, butanol, 2-ethoxy ethanol, 2-butoxy ethanol, 2-methoxy propanol, THF, ethylene glycol, pyridine, dimethylacetamide, N-vinyl pyrrolidone, methyl ethyl ketone, butanone, α-terpinol, formic acid, ethyl acetate and acrylonitrile, may be used.

Further, in the dispersed composition, the graphene flake to the surface of which the dispersant is physically attached may be included in about 50 parts by weight or less, based on 100 parts by weight of the polar solvent, and even in the case where the graphene flake is included in a high concentration of about 50 parts by weight at maximum, the graphene flake may be maintained in a state of being uniformly dispersed.

As such, in the dispersed composition, by the action of the certain dispersant physically attached to the graphene flake, the graphene flake may represent excellent dispersibility to various polar solvents per se. Therefore, the dispersed composition may be maintained in a state where the graphene flakes is uniformly dispersed in various polar solvents in a high concentration, considering the use to be applied in practice, and the like. Therefore, the dispersed composition may express the excellent properties of the graphene in a maximized manner, and be applied in various uses requiring the application of the graphene.

More specifically, the dispersed composition of graphene may be used as a conductive paste composition, a conductive ink composition, a composition for forming a heat dissipation substrate, an electrically conductive composite, a composite for EMI shielding, or a conductive material for a battery, and besides, may be applied to any use where it is known that the application of graphene in a dispersed state is possible or needed.

EXAMPLES

Hereinafter, the action and effect of the invention will be described in detail, through the specific examples of the invention. However, the examples are provided only to illustrate the present invention, and the scope of the invention is in no way determined thereby.

Preparation Example 1: Preparation of Dispersant

Pitch which is a petroleum byproduct available from POSCO underwent an oxidation process and a refining process as follows, thereby preparing the dispersant of Example 1.

First, 0.5 to 1.5 g of pitch was added to 75 ml of a mixed solution of sulfuric acid/nitric acid (volume ratio 3:1), and an oxidation reaction proceeded at 70° C. for about 3.5 hours.

Thereafter, a pitch reaction solution in which the oxidation reaction proceeded, was cooled to room temperature, and diluted with distilled water to an about 5-fold solution, and then centrifuged at about 3500 rpm for 30 minutes. Then, supernatant was removed, the same amount of distilled water was added to the solution which was then redispersed, and thereafter, centrifugation was performed again under the same condition to finally collect and dry precipitate. Through this process, the dispersant of Example 1 was prepared.

First, the molecular weight distribution of the pitch used in the preparation process of the dispersant as a raw material was analyzed by a MALDI-TOF mass spectrum, and the results are shown in FIGS. 2A and 2B (enlarged views in the range of molecular weight of 400 to 500); and the molecular weight distribution of the dispersant of Preparation Example 1 was analyzed similarly, and the results are shown in FIGS. 3A and 3B (enlarged views in the range of molecular weight of 400 to 500). The analysis was carried out by adding the pitch or the dispersant to a matrix, mixing them, and then drying the mixture, using a MALDI-TOF mass spectrum equipment (Ultraflex II, Bruker).

Referring to FIGS. 2A and 2B (enlarged views), it was confirmed that the pitch includes polyaromatic hydrocarbons having a molecular weight of 200 to 1500, and especially, from the detection of large peaks in an interval of a molecular weight of 14 Da in an enlarged view of FIG. 2B, plural kinds of polyaromatic hydrocarbons having a different number of aromatic rings (benzene rings) from each other are connected by aliphatic hydrocarbons. By contrast, referring to FIGS. 3A and 3B (enlarged views), it was confirmed that in case of the dispersant of Preparation Example 1, large peaks existing in an interval of 44 Da and 16 D, respectively in the polyaromatic hydrocarbons are observed, which proves the presence of the mixture of the polyaromatic hydrocarbon oxides in which an oxygen-containing functional group such as —COOH, —OH or —SO$_3$H is introduced to the aromatic hydrocarbons, wherein the oxides having a molecular weight of about 300 to 1000, or 300 to 700 are contained in 60% by weight or more.

Further, the pitch used as the raw material (upper) and the dispersant of the Preparation Example 1 (lower) were analyzed by a 13C CPMAS NMR (Varian 400 MHz Solid-State NMR), respectively, and the analysis results are shown in FIG. 4 by comparison. Referring to FIG. 4, a carbon-derived peak of the aromatic hydrocarbons, and a carbon-derived peak of some aliphatic hydrocarbons were confirmed in the pitch, but the presence of the oxygen-containing functional group was not confirmed. By contrast, as a result of NMR analysis of the dispersant of Preparation Example 1, a peak of the oxygen-containing functional group was confirmed. The kind of the oxygen-containing functional group was confirmed to be an epoxy group, a hydroxy group, a carboxy group, or the like.

In addition, the pitch used as the raw material and the dispersant of Preparation Example 1 were analyzed by FT-IR (Agilent 660-IR) in a powder state, respectively, and the analysis results are shown in FIG. 5 by comparison. Through FIG. 5 also, it was confirmed that the peak of the oxygen-containing functional group was produced in the dispersant of Preparation Example 1.

Preparation Examples 2 to 4: Preparation of Dispersant

The dispersant of Preparation Examples 2 to 4 were prepared, respectively, in the same manner as Preparation Example 1, except that pitch which is a petroleum byproduct available from POSCO (however, the pitch was from a different sample from that of Preparation Example 1) was used, and the oxidation reaction time was 1 hour (Preparation Example 2), 3.5 hours (Preparation Example 3), and 7 hours (Preparation Example 4), respectively.

The dispersants were analyzed by a MALDI-TOF mass spectrum, in the same manner as Preparation Example 1, and the results are shown together in FIG. 6 by comparison. Referring to FIG. 6, it was confirmed that as the oxidation time increases, the content of the components having a molecular weight more than about 1000, or about 700 (polyaromatic hydrocarbon oxides) in the dispersant is reduced, and thus, the dispersant in the form of a mixture containing the polyaromatic hydrocarbon oxides having a molecular weight of about 00 to 1000, or about 300 to 700 in a higher content, was obtained.

Experimental Example 1: Measurement of Oxygen Content of Dispersant 1 mg of the dispersant samples obtained in Preparation Examples 3 and 4 were heated to a high temperature of about 900° C. around on a thin foil. At this time, as the foil is instantaneously melted, the temperature was raised to about 1500 to 1800° C., and by such high temperature, gas was generated from the sample. The gas was collected and subjected to elemental analysis to measure and analyze the content of each element of carbon, oxygen, hydrogen and nitrogen. The results of this analysis are shown in following Table 1, as compared with the analysis results of the pitch used for preparation of each dispersant.

TABLE 1

| Sample name | C (wt %) | H (wt %) | N (wt %) | O (wt %) |
|---|---|---|---|---|
| pitch | 95.5 | 4.5 | — | — |
| Preparation Example 3: | 40.0 | 1.8 | 7.6 | 38.0 |
| Preparation Example 4: | 40.0 | 1.5 | 7.8 | 39.2 |

Referring to Table 1, it was confirmed that the oxygen content was about 12 to 50% by weight, or about 30 to 40% by weight in the dispersant of Preparation Examples 3 and 4, based on the total element content, when analyzing the content of each element.

Comparative Preparation Example 1: Dispersant

A commercialized dispersant of following Chemical Formula 1 (PNS) was used in Comparative Preparation Example 1.

[Chemical Formula 1]

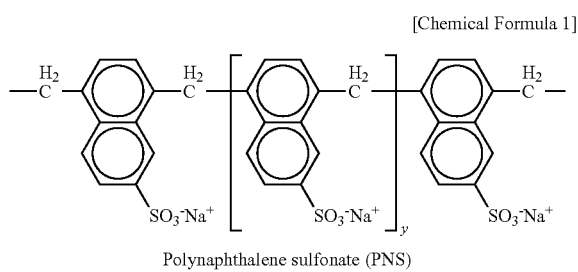

Polynaphthalene sulfonate (PNS)

Comparative Preparation Example 2: Dispersant

A commercialized dispersant, sodium dodecyl benzene sulfonate (SDBS) was used in Comparative Preparation Example 2.

Example 1: Preparation of Graphene Flake 0.5 g of pristine graphite was added to 100 ml of aqueous dispersion where 15 mg of the dispersant of Preparation Example 1 is dispersed to form dispersion. A tip-type ultrasonic irradiator was used to irradiate the dispersion with ultrasonic wave continuously in twice, at 320 W every 30 minutes, thereby exfoliating the graphite and preparing the graphene flake of Example 1.

In FIG. 7, a micrograph of the graphite used as a raw material for preparation of the graphene flake is shown in (a), and a micrograph of the graphene flake prepared in Example 1 is shown in (b). Referring to (b) in FIG. 7, it was confirmed that the graphene flake was relatively well-formed.

Example 2: Preparation of Graphene Flake

Dispersion of pristine graphite was formed in the same manner as Example 1. The dispersion was passed through a high speed homogenizer spinning at 12000 rpm for 1 hour. Through this, the graphite was exfoliated, and the graphene flake of Example 2 was prepared.

In FIG. 7, a micrograph of the graphite used as a raw material for preparation of the graphene flake is shown in (a), and a micrograph of the graphene flake prepared in Example 2 is shown in (c). Referring to (c) in FIG. 7, it was confirmed that the graphene flake was relatively well-formed.

Example 3: Preparation of Graphene Flake

Dispersion of pristine graphite was formed in the same manner as Example 1. A chamber of a bead mill having 0.3 mm $ZrO_2$ beads, and filled with beads by wet 10 times was applied, and the dispersion was passed through the chamber of the bead mill to carry out milling and pulverization. Through this, the graphite was exfoliated, and the graphene flake of Example 3 was prepared.

In FIG. 7, a micrograph of the graphite used as a raw material for preparation of the graphene flake is shown in (a), and a micrograph of the graphene flake prepared in Example 3 is shown in (d). Referring to (d) in FIG. 7, it was confirmed that the graphene flake having a thickness of 50 nm around was relatively well-formed.

Example 4: Preparation of Graphene Flake

Dispersion of pristine graphite was formed in the same manner as Example 1. The dispersion was introduced to the inlet of the high pressure homogenizer at high pressure of about 1600 bar to be passed through a micro-channel, and this process was repeated 10 times. Through this, the graphite was exfoliated, and the graphene flake of Example 4 was prepared.

In FIG. 7, a micrograph of the graphite used as a raw material for preparation of the graphene flake is shown in (a), and micrographs of the graphene flake prepared in Example 4 are shown in (e) and (f) (enlarged view of (e)). Referring to (e) and (f) of FIG. 7, it was confirmed that the graphene flake having a small thickness and a large area, and with minimized defects as compared with Examples 1 to 3, was formed very well.

The graphene flake of Example 4 was subjected to TEM analysis, and the images are shown in (a) and (b) (enlarged view of (a)) in FIG. 8. Referring to (a) of FIG. 8 above, it was confirmed that the graphene flake prepared in Example 4 was that having a very large area with a diameter of about 0.5 to 5 μm. Further, referring to (b) of FIG. 8 above, it was confirmed that the graphene flake of Example 4 had a very small thickness so that a carbon grid in the lower part (red arrow in the drawing) disposed for TEM analysis is observed through the graphene flake.

In addition, the graphene flake of Example 4 was subjected to AFM analysis, and the results are shown in (c) and (d) of FIG. 8, respectively. Referring to this, it was confirmed that the graphene flake of Example 4 had a very small thickness of about 6 to 17 nm.

Comparative Example 1: Preparation of Graphene Flake 1.0 g of the dispersant of Comparative Preparation Example 1, 50 mL of water and 2.5 g of pristine graphite were mixed to form dispersion. The dispersion was introduced to the inlet of the high pressure homogenizer at high pressure of about 1600 bar to be passed through a micro-channel, and this process was repeated 10 times. Through this, the graphite was exfoliated, and the graphene flake of Comparative Example 1 was prepared.

FIG. 9 is a micrograph of the graphene flake prepared in Comparative Example 1. Referring to FIG. 9, it was confirmed that in case of using the dispersant of Comparative Preparation Example 1, the exfoliation of the graphite was not performed well, for example, the prepared graphene flake was formed to be relatively thick.

Comparative Example 2: Preparation of Graphene Flake 1.0 g of the dispersant of Comparative Preparation Example 2, 50 mL of water and 2.5 g of pristine graphite were mixed to form dispersion. The dispersion was introduced to the inlet of the high pressure homogenizer at high pressure of about 1600 bar to be passed through a microchannel, and this process was repeated 10 times. Through this, the graphite was exfoliated, and the graphene flake of Comparative Example 2 was prepared.

FIG. 10 is a micrograph of the graphene flake prepared in Comparative Example 2. Referring to FIG. 10, it was confirmed that in case of using the dispersant of Comparative preparation Example 2 also, the exfoliating of the graphite was not performed well, for example, the prepared graphene flake was formed to be relatively thick.

Experimental Example 2: Evaluation of Redispersibility of Graphene Flake in Polar Solvent First, dispersion of the graphene flake was prepared in Example 4, and then centrifugation was carried out at 8000 rpm for 30 minutes to collect the precipitate, graphene flakes. Thereafter, the graphene flake was vacuum dried in an oven at 55° C. for 3 days to be obtained in a dry state.

20 mg of the graphene flake powder was added to 10 ml of various solvents shown in FIG. 11, and redispersed by a bath type sonicator for 1 hour. FIG. 11 is a visually observed photograph showing the results of evaluating the redispersibility.

In addition, the dispersion of the graphene flake prepared in Comparative Example 1 was also treated identically to obtain the graphene flake in a dry state, and then the redispersibility in the polar solvent (water) was evaluated in the same manner. The visually observed photograph representing the results of evaluating the redispersibility is shown in FIG. 12, as compared with Example 4 above.

Referring to FIG. 11, it was confirmed that the graphene flake obtained from the Example may be very uniformly dispersed in various polar solvents in a high concentration. It is predicted that this was generated by the action of the certain dispersant used in the Example. In particular, the graphene flake prepared by the conventional method is agglomerated again in a polar solvent, so that it is difficult to be dispersed without additional treatment, however, differently from this, it was confirmed that the graphene flake of the Example may be uniformly dispersed in various polar solvents per se, and thus, is easily applicable in more various uses.

By comparison, referring to FIG. 12, it was confirmed that in case of using the dispersant of Comparative Preparation Example 1 (PNS), the graphene flake was not dispersed well, and present in a state of being attached to the wall of a vial as agglomerate, or being merely suspended in water.

This may be because dispersant of Preparation Example 1 is in the form of a mixture of various kinds of polyaromatic hydrocarbon oxides, differently from the dispersant of Comparative Preparation Example 1, merely having the form of 1 or 2 kinds of separated compounds, and the molecular weight range and the content range of the polyaromatic hydrocarbon oxides were optimized to more effectively interact with a carbon-based material, and through this, the carbon-based material may be better dispersed and exfoliated.

Particularly, when comparing Examples 1 and 4 with Comparative Example 1, the dispersants of Examples 1 and 4 were used in a smaller weight than Comparative Example 1, even in terms of the same weight of 2.5 g of originally used pristine graphite. Nevertheless, the Examples expressed excellent exfoliating property and dispersibility on the graphene flake, as compared with the Comparative Example, which supports a very excellent dispersion force of the dispersant according to the Examples and Preparation Examples, and the required use content of the dispersant is greatly reduced, which means that the amount of remaining dispersant that needs to be removed later from the graphene flake is also greatly reduced.

Experimental Example 3: Preparation of Graphene-Containing Film and Evaluation of Electrical Properties (Measurement of Sheet Resistance)

First, the graphene flake obtained in Example 4 was redispersed in water in various concentrations of 0.1, 0.5, 1.0, 2.0 and 3.0 mg/ml, respectively to form aqueous dispersion. 20 ml of the aqueous dispersion was vacuum-filtered using a porous AAO membrane having a diameter of 47 mm and a pore size of 200 nm, thereby preparing graphene-containing films. The sheet resistance of the graphene-containing films was measured in different areas from each other using a 4-point probe device, and the measurement results are shown in FIG. 13.

Referring to FIG. 13, as the concentration of graphene flake in the aqueous dispersion is increased, the film thickness is increased, and thus, the sheet resistance tends to be decreased. It was confirmed that the graphene-containing film has overall, low sheet resistance and excellent electrical conductivity. It was confirmed therefrom that even in the case of the graphene flakes of the Examples have a small thickness, the graphene flake represents somewhat excellent electrical properties, and the dispersant physically attached to the graphene flake surface has little adverse effect on the electrical conductivity of the graphene flake.

Meanwhile, 5.0 g of the dry graphene flake of Example 4 and 12 ml of NMP were mixed, and stirred using a paste mixer at 1500 rpm for 2 minutes to obtain a paste composition having high viscosity. Such paste composition was bar-coated on a PET substrate, and dried in an oven at 100° C. for 30 minutes to remove remaining solvent. By such method, the graphene-containing film was formed, and sheet resistance was measured at 11 points on the film, using a 4-point probe device.

FIG. 14 shows measurement results of sheet resistance of the film with appearance of the formed film.

Referring to FIG. 14, the average of the sheet resistance is about 47.5 ($\pm$4.8)$\Omega/\square$, and thus, it was confirmed that the film has low sheet resistance and excellent electrical conductivity even in a relatively thick state of the film. Through this, it was confirmed that the graphene flake may be used in various fields or applications, for example, it may be used to form a conductive paste, an ink composition for inkjet printing, or a conductive ink composition, which is applied to form a conductive pattern, or applied in the film state to a material of a heat dissipation substrate and the like.

The invention claimed is:

1. A preparation method of graphene, the preparation method comprising:
applying a physical force to dispersion of a carbon-based material including graphite or a derivative thereof, and a dispersant,
wherein the dispersant includes a mixture of plural kinds of polyaromatic hydrocarbon oxides, containing the polyaromatic hydrocarbon oxides having a molecular weight of 300 to 700 in a content of 70% to 95% by weight
wherein the dispersant has an oxygen content of 12 to 50% by weight, based on total element content and
the graphite or the derivative thereof is formed into a graphene flake having a thickness in nanoscale under application of the physical force.

2. The preparation method of claim 1, wherein the graphite or the derivative thereof is one or more selected from the group consisting of graphite, expanded graphite, indeterminate graphite, planar graphite, artificial graphite, modified graphite having an intercalation compound inserted in a carbon interlayer, and carbon nanofiber.

3. The preparation method of claim 1, wherein the dispersion is dispersion where the carbon-based material and the dispersant are dissolved or dispersed in an aqueous solvent or a polar organic solvent.

4. The preparation method of claim 1, wherein the polyaromatic hydrocarbon oxides contained in the dispersant have a structure where one or more oxygen-containing functional group are bonded to an aromatic hydrocarbon containing 5 to 30 benzene rings.

5. The preparation method of claim 4, wherein the aromatic hydrocarbon has 7 to 20 benzene rings in the structure.

6. The preparation method of claim 1, wherein the applying of the physical force proceeds by a method using a high speed homogenizer, a high pressure homogenizer, a ball mill, a bead mill or an ultrasonic irradiator.

7. The preparation method of claim 1, wherein the graphene flake has a thickness of 1.5 to 50 nm.

8. The preparation method of claim 1, wherein the graphene flake has a diameter of 0.1 to 10 µm, and a diameter/thickness ratio of 50 to 6000.

9. The preparation method of claim 1, wherein the graphene flake is formed in a state where the dispersant is physically attached to a surface of the graphene flake.

10. The preparation method of claim 1, further comprising recovering the graphene flakes from the dispersion of the graphene flakes, and drying the graphene flakes.

11. The preparation method of claim 10, wherein the recovering proceeds by centrifugation, vacuum filtration or pressure filtration.

12. The preparation method of claim 10, wherein the drying proceeds by vacuum drying at a temperature of 30 to 200° C.

* * * * *